United States Patent [19]

Loucks

[11] Patent Number: 4,755,740

[45] Date of Patent: Jul. 5, 1988

[54] CIRCUIT FOR POWER PULSE AMPLITUDE STABILIZATION IN RADAR TRANSMITTER PULSE MODULATOR OR THE LIKE

[75] Inventor: Richard S. Loucks, Northridge, Calif.

[73] Assignee: ITT Gilfillan, a division of ITT Corporation, Van Nuys, Calif.

[21] Appl. No.: 56,027

[22] Filed: Jun. 1, 1987

[51] Int. Cl.[4] .............................................. G05F 1/613
[52] U.S. Cl. ...................................... 323/224; 328/67;
307/271; 342/132
[58] Field of Search ........................ 323/223, 224, 225;
307/106, 108, 264, 265, 268, 271, 282; 342/132;
328/67

[56] References Cited

U.S. PATENT DOCUMENTS 4,371,830 2/1983 Loucks ................................. 323/265

*Primary Examiner*—Patrick R. Salce
*Assistant Examiner*—Judson H. Jones
*Attorney, Agent, or Firm*—Robert A. Walsh; Thomas N. Twomey; Mary C. Werner

[57] ABSTRACT

A pulse modulator for a radar system employing resonant charging of a pulse forming network and circuits for periodically discharging the network to form a power pulse applied to a microwave transmitter such as a magnetron, for example. The system includes circuits for controlling the pulse forming network charge effective at a time ahead of the discharging of the network, thereby to stabilize (regulate) the power pulse amplitude. The circuits shown provide for introduction of an increment of charge current independently of the resonant charging current of a magnitude determined by evaluation of the pulse forming network terminal voltage.

15 Claims, 2 Drawing Sheets

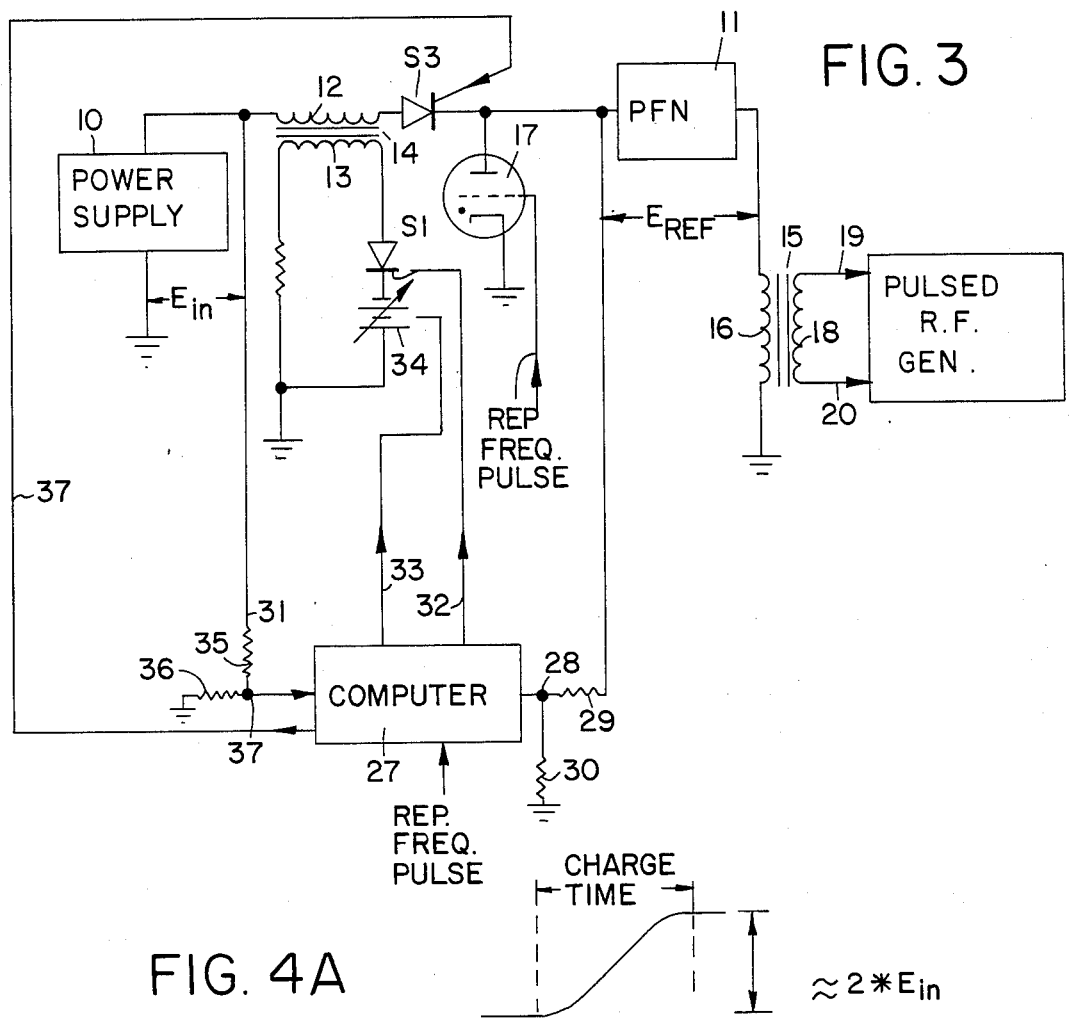

CIRCUIT FOR POWER PULSE AMPLITUDE STABILIZATION IN RADAR TRANSMITTER PULSE MODULATOR OR THE LIKE

BACKGROUND OF THE INVENTION

The invention relates generally to systems for power pulse regulation and more particularly to such pulse regulation in systems with resonant charging of a pulse forming network. In various applications, an electrical power pulse having a high order of amplitude stability is required. This is particularly true of the transmitter-modulator pulses typical in pulsed radar systems. In such systems a power pulse of a few microseconds duration is typically generated at a pulse repetition frequency which may be fixed or variable. Such pulses are then applied to a microwave pulse generator such as a magnetron, or to an amplifier employing a travelling wave tube or the like, driven in a master oscillator-power amplifier configuration. The microwave pulse generators aforementioned are inherently sensitive to driving pulse amplitude and stability in respect to the frequency generated. In modern moving target indication radar systems, the stability of the microwave frequency is of particular importance, as is well-known to those of skill in the art.

Systems for regulating (stabilizing) the amplitude of repetitive power pulses generated by a resonant charging transmitter modulator are frequently called "de Quing" systems, and it is to such systems that the invention is particularly applicable. In such systems, the regulation of the pulse forming network of the system is usually undertaken by one means or another.

A prior art stabilization system is described in U.S. Pat. No. 4,371,830 (common assignee and inventorship vis-a-vis the invention). Although that system is relatively effective in reducing loss from dissipation of stored energy, it does not address the small, but important, variations of resonant charging peak amplitude.

Additional source of error in prior art systems are power supply ripple and the fact that the characteristic impedance of the pulse forming network does not continuously match the microwave generator load in frequency agile systems.

Direct regulation of the input power supply would be expected to be ideal, however such an arrangement is neither cost nor energy efficient. Moreover, design complications due to the high order of accuracy required (frequently at a relatively high voltage) tend to make direct regulation relatively unattractive.

Prior art systems usually dissipate a significant amount of energy, resulting in heat build-up and inefficient use of initial energy.

Since the charge current at the switching time flows through a charging choke and the pulse forming network, a significant amount of energy is stored in the network inductance. This energy represents an error signal randomly added to or subtracted from the network charge and is therefore a further source of output power pulse amplitude instability.

The manner in which the invention advances the art will be evident as this description proceeds.

SUMMARY OF THE INVENTION

Basically, the invention contemplates switching control of the charge cycle and a computed boost in the charging choke stored energy prior to initializing the charge cycle. This added quantity of stored energy available for production of the transmitter-modulation output pulse is determined by measurement of the additional charge required to effect full resonant charging of the pulse forming network. The result is network charging to a full predetermined (reference) voltage without the necessity for dumping residual energy or dumping out of inductive swings (ringing) in the network terminal voltage.

A computer circuit conventionally implemented serves to compute the charge required to yield the desired network voltage, based on circuit parameters such as network capacitance, residual charge from prior pulses, power supply voltage and parasitic leakage and losses. Several aspects and features of the novel combination will be evident as this specification proceeds, however, the most basic elements of the combination include the timed initiation of the resonant charge and the controlled prior current increment independently introduced into the network charging circuit.

The details of a typical and illustrative embodiment according to the invention will be presented in the description to follow. It may be said to have been the general objective of the invention to provide a simple, inexpensive and accurate circuit for power pulse amplitude regulation (stabilization).

BRIEF DESCRIPTION OF THE DRAWINGS

FIG. 3 is a circuit diagram of a practical configuration for practicing the invention in accordance with the concepts of FIG. 2.

FIGS. 4A-4E present voltage and current waveforms for clarity of explanation of the prior art and also of the inventive combination.

DETAILED DESCRIPTION

Figure 1:
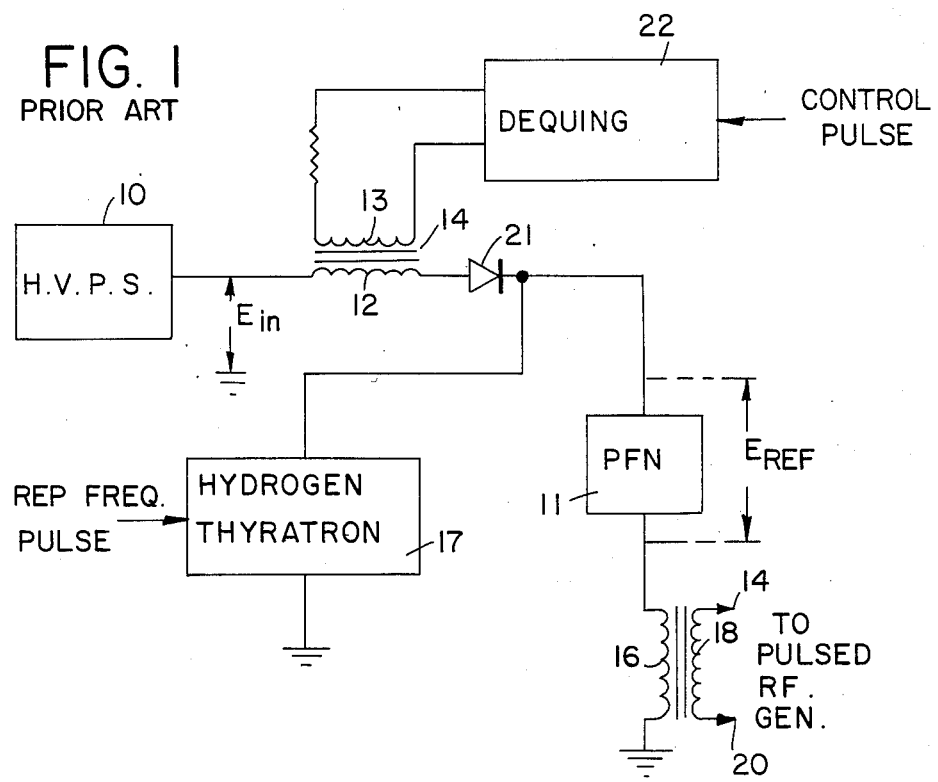
FIG. 1 is a basic block diagram of a prior art resonant charging pulsed transmitter-modulator.

Referring now to the drawings, the circuit schematic of a typical prior art pulse modulator with charging choke energy dumping (de Quing) is depicted in FIG. 1. This is the basic configuration well-known in the prior art textbook and patent literature, including the book "Radar Handbook" by Merrill I. Skolnik, (McGraw Hill Book Co. 1970). It is also the basic system with which the improvement described in U.S. Pat. No. 4,371,830 is associated.

In FIG. 1, a high voltage power supply 10 charges a pulse forming network 11 through a charging choke (inductor) 12 which is the primary winding of transformer 14. The inductance of winding 12, the magnitude of the voltage supplied by power supply 10 and the characteristics of the pulse forming network 11 are coordinated to produce resonant charging of the network 11 to a voltage nearly double the power supply potential. Of course the network 11, which produces a current pulse (on discharge) through the primary 16 of pulse transformer 15, is usually designed as an artificial (lumped constant) section of transmission line. Thus when the network charge is dumped by the firing of hydrogen thyration 17 acting as a switch, a power pulse appears across the secondary 18 of pulse transformer 15. This is the transmitter-modulator pulse (at terminals 19 and 20) which would be applied to a transmitting RF power generator, such as a magnetron, etc., for generation of a corresponding pulse of microwave energy in a pulsed radar system.

In FIG. 4, wavefore A, an approximate voltage waveform ($E_{REF}$) during charge of network 11 is depicted. During the charge time the charge current into network 11 peaks substantially at the time the charge current (FIG. 4B) falls to zero. Hold-off diode 21 acts to prevent discharge of network 11 from the $=2E_{in}$ level for a time beyond the charge time duration as the resonant charging drive diminishes.

The prior art de Quing circuit responds to a control pulse to dissipate the remaining energy of the charging choke 12. With the collapse of the magnetic field built up in the core of 14, a relatively large amount of energy is thus dumped.

Figure 2:
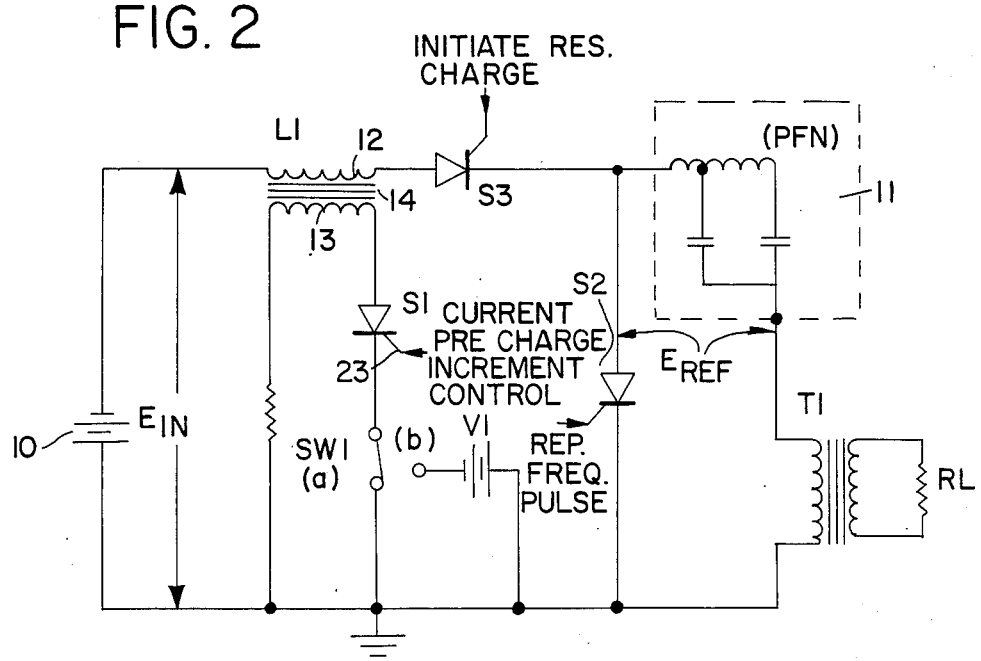
FIG. 2 is a conceptual circuit diagram illustrating the novel structural and functional aspects of the invention.

Referring now to FIG. 2, the arrangement shown introduces the concept of interruption of the charging time at a controlled time prior to the full sine wave resonant charging point. (See FIG. 4C). The resulting $E_{REF}$ value is thus less than 2 $E_{in}$, allowing a margin into which an increment of additional charging current is added by means of a separate pre-charge circuit. In the implementation of such a concept, the hold-off diode is converted to a one-way switch 53, represented as a solid state device such as the familiar SCR. The control lead 23 signal is timed to interrupt the charging current at point 24 on FIG. 4C. The solid state switch S2 provides the same function as the hydrogen thyration depicted on FIG. 1 and again on FIG. 3. Switch S1 of FIG. 2 initiates the increment of charge boost needed to achieve a regulated $E_{REF}$ value depicted on FIG. 4E. At point 26 on FIG. 4E, the normal resonant charging begins in accordance with activation of S3 at FIG. 4D, the residual charge current (relatively small) is allowed to decay after point 25 with SW, in the (a) position. For the aforementioned measured precharge cycle boost, SW1 would be in the (b) position until point 26 on FIG. 4E.

Referring now to FIG. 3, a practical circuit for implementation of the invention is shown. In this circuit, the solid state device S1 performs its functions as if SW1 on FIG. 2 were permanently in position (b). The solid state switch S introduces the pre-resonant charge current increment illustrated in FIG. 4E at a predetermined time before S3 is controlled to initiate the resonant charge period.

The computer 27 can be readily implemented by a person of skill in the art from knowledge of the desired functions. Since the system function of the invention or any other pulse control arrangement is to stabilize (regulate) the output pulse between terminals 19 and 20, sensing of $E_{REF}$ is undertaken. Since the output pulse to be stabilized is a direct function of $E_{REF}$, it is not necessary to sense the pulse directly. Sensing of $E_{REF}$ is less difficult. A voltage divider comprising resistors 29 and 30 fractionates $E_{REF}$ at point 28 into the computer 27. The computer preferably contains a built-in reference against which the voltage at 28 may be compared at a time prior to the Repetition Frequency Pulse but after the charge cycle. Built in timing places the control signals on 32 and 33 in relation to overall system timing. Moreover, the signal on 31 will be seen to control the variable current source 34 in accordance with the computed value for each pre-charge current boost. Lead 31 provides a sample of $E_{in}$ as supplied from power supply 10 through the voltage divider comprised of resistors 35 and 36. Thus the voltage at point 37 is of the same general magnitude (scale factor) as is true at point 28.

The elements of FIG. 3 common with FIG. 1 and FIG. 2 are consistently identified and accordingly no further explanation of their nature and function is necessary.

The computer 27 may be constructed to respond to the values at 28, 37 and to predetermined parameters such as network capacitance, residual charge from prior pulses and power supply variations.

It will be seen that S1 is energized during the normal quiescent period before the resonant charge begins by activation of solid state switch S3. It will be noted that termination of the pre-charge current increment is passive, through current reversal quenching (back biasing) provided by S3 once the resonant charge cycle is initiated. It is important to note that the system according to the invention contemplates adding of incremental charging current -- not dissipation at any point to achieve regulation.

The pre-charge current increment introduced prior to activation of S3 as illustrated at FIG. 4E is itself a transient signal capable of being coupled by transformer action into winding 13 of transformer 12 (acting as the charging choke) from an auxiliary controllable variable power source 34. The current increment is initiated by S1 prior to activation of S3.

The computer 27 is conventionally constructed to provide timing control pulses to S1 and S3 via leads 32 and 37, respectively. The computer can, of course, be programmed to terminate the resonant charge cycle before firing of switch 17 (hydrogen thyration, for example) to avoid unintended power drain through the charge choke 13. Still further, the computer determines the magnitude of the pre-resonant-charging current increment by controlling variable auxiliary power source 34 via lead 33.

It will be recognized that various configurations for providing the controllable incremental current signal into winding 13 are readily available to the skilled practitioner in this art. The showing of variable source 34 is conceptual for the purpose.

It will also be realized that as a variation, the "lead" of the initiation of S1 over initiation of S3 (see FIG. 4E), although presumed to be a fixed timing factor determined in computer 27 acting as a synchronizer, nevertheless, could be made variable as a function of the computer determination of the required initial current increment, in lieu of or in addition to the variable source 34 magnitude control. Coupling of the initial current through winding 13 and the resulting transformer action into inductor winding 12 has the particular advantage that the auxiliary (initial) current components are isolated from the high voltages associated with the resonant charging.

Other variations and modifications within the scope of the novelty will suggest themselves to the skilled reader, it therefore not being intended that the invention should be regarded as limited to the specifics of the drawings on this description. The drawings and description are intended to be typical and illustrative only.

It will be evident from an understanding of the invention that the general objective of the invention, as hereinbefore stated, has been met.

What is claimed is:

1. In a pulse modulator employing resonant charging of a pulse forming network from a primary power source through an inductor, having a first winding on a magnetizable core and including a first electronic switch for discharging said network into a utilization device periodically in response to an externally supplied repetition frequency pulse, the combination comprising:

second electronic switching means in series between said inductor and said network for controlling the initiation of a resonant charging current into said network at a first predetermined time;

third electronic switching means and auxiliary current source means activated thereby at a time prior to operation of said second electronic switching means for introducing an initial current through said inductor and network; and computer means responsive at least to said network terminal voltage for controlling the magnitude of said initial current.

2. The combination set forth in claim 1 including a second winding on said inductor magnetizable core, said third electronic switching means being arranged to connect said auxiliary current source means to cause current to flow in said second winding and therefore in said first winding during closure of said third switching means.

3. The combination set forth in claim 2 in which said auxiliary current source provides a variable current as a function of a corresponding control signal from said computer mass.

4. The combination set forth in claim 1 in which said computer means is also responsive to the voltage provided by said primary power source at a time prior to operation of said third electronic switching means, for determining the magnitude of said variable current into said second winding.

5. The combination according to claim 1 in which said first and third electronic switching means are solid state devices providing unipolar current flow during operation.

6. The combination according to claim 1 in which said second electronic switching means is a controllable solid state device permitting current flow in only one direction, therefore acting as a hold-off diode during the period following achievement of peak charge of said network and prior to operation of said first electronic switching device.

7. The combination according to claim 2 in which said second electronic switching means is a controllable solid state device permitting current flow in only one direction, therefore acting as a hold-off diode during the period following achievement of peak charge of said network and prior to operation of said first electronic switching device.

8. The combination according to claim 3 in which said second electronic switching means is a controllable solid state device permitting current flow in only one direction, therefore acting as a hold-off diode during the period following achievement of peak charge of said network and prior to operation of said first electronic switching device.

9. The combination according to claim 5 in which said second electronic switching means is a controllable solid state device permitting current flow in only one direction, therefore acting as a hold-off diode during the period following achievement of peak charge of said network and prior to operation of said first electronic switching device.

10. The combination according to claim 1 including a pulse transformer having primary and secondary windings, said primary winding being connected in series with said pulse forming network such that operation of said first electronic switch discharges said network into said utilization device through said pulse transformer, said secondary winding providing an output to said utilization device.

11. A pulse generator with pulse amplitude regulation, for generating a series of power pulses to a utilization device at a predetermined repetition frequency, comprising:

a main source of substantially continuous DC electric power;

a pulse forming network in the form of an artificial transmission line for predetermining the duration of said power pulses;

a first winding on a magnetizable core operable as a charging inductor;

a first electronic switch operable from an externally provided pulse at said repetition frequency for periodically discharging said pulse forming network through a circuit including a utilization device;

a second electronic switch operable to pass current from said main power source in a charging circuit through said charging inductor into said pulse forming network for resonant charging;

means for introducing a preliminary current flow into said charging circuit independently of the operation of said main power source and said second electronic switch, comprising an auxiliary electric current source, a second winding on said magnetizable core and a third electronic switch connected in a circuit to introduce a pre-resonant charge current into said second winding when said third electronic switch is operated;

12. The combination according to claim 11 in which said second electronic switch has a unidirectional current characteristic to pass said resonant charging current, but acting as a hold-off diode once the peak voltage of said resonant charging has been reached.

13. The combination according to claim 11 in which said second and third electronic switches are controllable solid state devices.

14. The combination according to claim 13 in which said second and third electronic switches are controllable solid state devices.

15. The combination according to claim 11 in which a pulse transformer having primary and secondary windings is inserted with said primary winding in the discharge current path of said pulse forming network, said secondary winding being connected to said utilization device.

* * * * *